United States Patent
Bosse et al.

(10) Patent No.: US 7,639,019 B2
(45) Date of Patent: Dec. 29, 2009

(54) METHOD AND CONFIGURATION FOR MONITORING A VEHICLE BATTERY

(75) Inventors: Rolf Bosse, Orchard Lake, MI (US); Guy Cleymans, Zemst (BE); Mark Kado, Gross Pointe Park, MI (US)

(73) Assignee: Volkswagen of America, Inc., Auburn Hills, MI (US)

( * ) Notice: Subject to any disclaimer, the term of this patent is extended or adjusted under 35 U.S.C. 154(b) by 132 days.

(21) Appl. No.: 11/784,409

(22) Filed: Apr. 6, 2007

(65) Prior Publication Data

US 2008/0246488 A1    Oct. 9, 2008

(51) Int. Cl.
*G01N 27/416* (2006.01)
(52) U.S. Cl. .................. 324/426; 320/134; 320/104
(58) Field of Classification Search .......... 324/426, 324/427, 429; 320/104, 134
See application file for complete search history.

(56) References Cited

U.S. PATENT DOCUMENTS

| 5,130,659 | A | 7/1992 | Sloan |
| 5,900,734 | A | 5/1999 | Munson |
| 6,097,193 | A | 8/2000 | Bramwell |
| 6,424,157 | B1 | 7/2002 | Gollomp et al. |
| 6,472,875 | B1 | 10/2002 | Meyer |
| 7,400,232 | B2 * | 7/2008 | Reichling et al. ...... 340/426.36 |
| 2006/0232379 | A1 * | 10/2006 | Shelley et al. .............. 340/5.62 |
| 2007/0080662 | A1 * | 4/2007 | Wu .......................... 320/110 |

FOREIGN PATENT DOCUMENTS

DE    4225514 A1    2/1994

OTHER PUBLICATIONS

Search Report issued by the German Patent Office for German Patent Application No. DE 10 2008 007 801.8, dated Sep. 17, 2008.

* cited by examiner

*Primary Examiner*—Edward Tso
*Assistant Examiner*—Aaron Piggush
(74) *Attorney, Agent, or Firm*—Manfred Beck, P.A.

(57) ABSTRACT

A method for monitoring a battery includes the steps of activating a power conservation mode of an electrical system of a motor vehicle, measuring a duration of activation of the power conservation mode of the electrical system, and measuring a quiescent voltage of a vehicle battery of the motor vehicle. A battery status is determined based on the duration of activation of the power conservation mode and based on the quiescent voltage of the vehicle battery. Information indicative of the battery status is provided such that the information is perceivable outside the motor vehicle. A flashing pattern of a light emitting diode may for example indicate the battery status. A motor vehicle having a battery monitoring configuration is also provided.

11 Claims, 4 Drawing Sheets

METHOD AND CONFIGURATION FOR MONITORING A VEHICLE BATTERY

BACKGROUND OF THE INVENTION

Field of the Invention

The invention relates to a method for monitoring a vehicle battery and to a motor vehicle having a battery monitoring configuration.

U.S. Pat. No. 6,424,157 B1 discloses a method and a device for monitoring and reporting on the condition of a vehicle battery. The monitoring device measures a battery voltage and a current drain during engine start and computes the battery dynamic internal resistance and the dynamic polarization resistance. The monitoring device also measures the quiescent voltage of the vehicle battery when the vehicle electrical system has only a small current drain and computes the state of charge of the vehicle battery. The monitoring device furthermore analyzes the battery condition in order to predict the time during which the vehicle battery can still start the engine and a minimum ambient temperature at which the vehicle battery will be able to start the engine. The measured and computed quantities can be displayed as messages as well as warnings to advise the driver of problems related to the vehicle battery.

U.S. Pat. No. 5,900,734 discloses a low battery voltage detection and warning system which is connected to a vehicle battery. The low battery voltage detection and warning system includes a voltage sensor connected to the vehicle battery for sensing a voltage value of the vehicle battery and a processing device connected to the voltage sensor for comparing the sensed voltage value to a reference value and determining if the sensed voltage value is less than the reference value. An alarm is connected to the processing device for generating an alarm upon a determination by the processing device that the sensed voltage value is less than the reference value. The alarm may produce on audible alarm and/or a visual alarm to alert the operator of the motor vehicle that the battery voltage is low and should be checked.

U.S. Pat. No. 5,130,659 discloses a battery monitor for indicating the projected time until the battery reaches a lower threshold value indicative of the energy capacity of the battery. The battery monitor includes a microprocessor which iteratively reads the value of the battery voltage. The microprocessor determines the rate of discharge of the battery and projects the future values of the battery voltage as well as the projected time at which the battery voltage attains the threshold voltage. The projected time is displayed on a visual indicator.

U.S. Pat. No. 6,472,875 B1 discloses a method for detecting a defect of a vehicle battery. The time dependence of the discharge voltage across the terminals of the vehicle battery is analyzed. First, at least two successive values of the discharge voltage of the vehicle battery are measured when cranking the engine of the motor vehicle for at least two consecutive engine cycles. A difference of the measured voltage values is determined and the onboard computer of the motor vehicle deduces whether the battery is charged or defective.

U.S. Pat. No. 6,097,193 discloses a vehicle starting battery cold-cranking amps meter which includes a current source, a voltage meter, a current meter, a temperature meter, and a control unit. The current source produces a current pulse during a brief time interval at a known magnitude that is less than the rated cold-cranking amps of the vehicle battery being tested. The voltage meter measures a battery terminal voltage of the vehicle battery while the current source is sourcing current to or sinking a current from the vehicle battery being tested. The control unit determines the internal impedance of the vehicle battery from the terminal voltage of the vehicle battery while the current source is sourcing current to or sinking current from the vehicle battery being tested and determines cold-cranking amps from the internal impedance and an output of the temperature meter.

The above-described methods and devices for monitoring a vehicle battery are suited for individual vehicle operators who want to check the vehicle battery when the motor vehicle is used under normal operating conditions. The audible and/or visual alerts are generally provided after a driver gets into the vehicle, inserts the ignition key into the ignition lock and activates the instrument panel of the motor vehicle. The above-described methods and devices for monitoring a vehicle battery are however not suited for vehicle manufacturers who want to routinely check vehicle batteries in a large number of vehicles, because the above-described methods and devices generally require unlocking each of the vehicles, getting into the vehicle, inserting the ignition key into the ignition lock and then checking the state of the battery. For example, a car manufacturer may produce hundreds of thousands of cars every year that are transported by train from manufacturing plants to seaports where the cars are loaded onto ships and are transported to Asia, Australia, Europe and North or South America. Once the motor vehicles arrive at a destination port, the motor vehicles go through a port processing and vehicle preparation program. These programs generally include a pre-delivery inspection or a so-called post-production check in order to conduct a final quality inspection and prepare the vehicles for distribution to the dealerships. In order to insure that the vehicles are operable and can be sold immediately upon arrival at the dealerships, the quality inspection generally includes a battery check so that any discharged batteries can be charged or batteries having a pre-existing damage can be replaced prior to delivery to dealerships. Even though the electrical system of the motor vehicle may have been in a power conservation mode or so-called transport mode, the battery check is still necessary because the batteries of the vehicles that arrive at the destination port may not have been charged for a number of weeks or even months, which may result in an excessive discharge of the batteries.

Further, as stated above, some of the vehicle batteries may have a pre-existing damage caused for example by manufacturing defects. In the past, the state of charge of each vehicle battery had to be manually measured by measuring the state of charge of each vehicle battery. A manual measurement of each vehicle battery is of course expensive and time-consuming. Even if one of the above-described methods or devices for monitoring a vehicle battery were to be used to check the vehicle batteries after the vehicles arrive at their destination ports, it would be necessary to unlock each vehicle, get into each vehicle, insert the ignition key and check whether there is a audible or visual warning that the battery needs to be charged or replaced. In case of a large number of vehicles, it is therefore time-consuming and expensive to check the battery of each motor vehicle.

SUMMARY OF THE INVENTION

It is accordingly an object of the invention to provide a method for monitoring a vehicle battery and a corresponding motor vehicle configuration which overcome the above-mentioned disadvantages of the heretofore-known methods and devices of this general type and which allow checking the battery status of vehicle batteries in each of a large number of vehicles in a time-efficient and cost-efficient manner. In particular, it is an object of the invention to provide a method and a device for monitoring a vehicle battery during transport or storage of the motor vehicle. Another object of the invention is to make it possible to have a cost-efficient detection of battery-related problems resulting from a transport or storage of a motor vehicle over an extended period of time.

With the foregoing and other objects in view there is provided, in accordance with the invention, a method for monitoring a battery that includes the steps of:

activating a power conservation mode of an electrical system of a motor vehicle;

measuring a duration of activation of the power conservation mode of the electrical system;

measuring a quiescent voltage of a vehicle battery of the motor vehicle;

determining a battery status based on the duration of activation of the power conservation mode and based on the quiescent voltage of the vehicle battery; and providing information indicative of the battery status such that the information is perceivable outside the motor vehicle.

An advantage of the above-defined method for monitoring a vehicle battery is that a person can easily check the status of the vehicle battery without having to open the vehicle and without having to insert a vehicle key as would be required in the case of a typical conventional battery monitoring system. The method according to the invention makes it possible to check the battery status of a large number of vehicles in a time-efficient and cost-efficient manner. Further by taking into account the duration of activation of the power conservation mode it is possible to provide an indication of whether the shelf life of the vehicle battery has been exceeded and whether the battery needs to be replaced rather than recharged.

Another mode of the method according to the invention includes providing the information indicative of the battery status by using a visual indicator device mounted in the interior of the motor vehicle and visible from outside the motor vehicle. This advantageously allows using one of the displays or indicator lights that are present in the interior of the motor vehicle for various purposes other than monitoring the vehicle battery when the vehicle electrical system operates in the normal operating mode. In other words, the method according to the invention does not require any extra hardware because indicator devices such as displays or light emitting diodes that are already present in the interior of motor vehicle can be used for the method according to the invention. In accordance with another mode, indicator devices mounted on the exterior of the motor vehicle such as light emitting diodes used as signaling lights or brake lights could be used for the purpose of indicating a battery status when the vehicle electrical system is in the power conservation mode and the engine is not running.

Another mode of the method according to the invention includes providing the information indicative of the battery status by using a light emitting diode mounted adjacent to a vehicle window such that the light emitting diode is visible from outside the motor vehicle; and controlling the light emitting diode such that the light emitting diode provides information that is not indicative of the battery status when the power conservation mode is deactivated. An advantage of using a light emitting diode is that it consumes very little power which reduces current drain during the power conservation mode. As explained above, no additional hardware is required for monitoring the vehicle battery when a light emitting diode that is already present for a purpose other than monitoring the vehicle battery is used for the method of the invention.

Another mode of the method according to the invention includes providing the information indicative of the battery status by using a flashing code such that a respective flashing pattern indicates a respective battery status. As described below, different flashing frequencies can be used as flashing patterns in order to indicate different battery statuses. For example, as the battery discharges over time, the flashing frequency could correspondingly decrease such that a high flashing frequency indicates a charged battery and a low flashing frequency indicates a discharged battery.

Another mode of the method according to the invention includes allocating the quiescent voltage of the vehicle battery to a voltage range selected from the group consisting of a voltage less than 11.6V, a voltage between 11.6V and 12.2V, a voltage between 12.2V and 12.5V, a voltage between 12.5V and 12.65V, and a voltage greater than 12.65V; and determining the battery status based on the duration of activation of the power conservation mode and based on the voltage range. By using the above-defined voltage ranges it is advantageously possible to determine whether the battery charge is substantially 0%, less than 50%, between 50% and 75%, more than 75% or 100%.

With the objects of the invention in view there is also provided, a motor vehicle configuration, including:

a motor vehicle having a vehicle electrical system including a control device, a vehicle battery, a voltage sensor and an indicator device;

the control device being configured to selectively operate the vehicle electrical system in a power conservation mode and in a normal operating mode;

the control device including a timer and being configured to determine a power conservation mode activation duration when operating the vehicle electrical system in the power conservation mode;

the voltage sensor being operatively connected to the vehicle battery and being configured to measure a quiescent battery voltage when the vehicle electrical system operates in the power conservation mode;

the control device determining a battery status as a function of the quiescent battery voltage and the power conservation mode activation duration; and the indicator device being operatively connected to the control device and being configured to provide information indicative of the battery status such that the information is perceivable from outside the motor vehicle.

An advantage of the above-defined configuration is that it can use hardware that is already present in the motor vehicle and thus no additional hardware is required for performing the battery monitoring function.

In accordance with another embodiment of the invention, the motor vehicle has a vehicle interior, the indicator device is a visual indicator device disposed in the vehicle interior. As explained above, this advantageously allows using displays or light emitting diodes that are disposed on the dashboard or door panels and are used for various other purposes when the electrical system in no longer in the power conservation mode.

In accordance with another embodiment of the invention, the motor vehicle has a vehicle interior and a vehicle window; and the indicator device is a light emitting diode disposed in the vehicle interior, adjacent to the vehicle window. Using a light emitting diode that is positioned adjacent to a vehicle window makes is easy to check the battery status from outside the vehicle.

In accordance with another embodiment of the invention, the indicator device provides information indicative of the battery status when the vehicle electrical system operates in the power conservation mode; and the indicator device provides information that is not indicative of the battery status when the vehicle electrical system operates in the normal operating mode. As explained above, by using the indicator device for two functions depending on whether the power conservation mode or the normal operating mode is active, it is possible to monitor the vehicle battery without additional hardware.

In accordance with another embodiment of the invention, the motor vehicle has a vehicle door with an inside door panel, the indicator device is a light emitting diode mounted on the inside door panel; the light emitting diode provides information indicative of the battery status when the vehicle electrical system operates in the power conservation mode; and the light emitting diode provides information indicative of the vehicle door being locked when the control device operates in the normal operating mode. Many vehicles have a light emitting diode indicating that the vehicle doors are locked and the vehicle alarm system is armed. This light emitting diode is usually positioned such that it can be easily seen from outside the motor vehicle and therefore it is advantageous to use this light emitting diode for the battery monitoring configuration according to the invention.

In accordance with another embodiment of the invention, the indicator device is a visual indicator device configured to selectively flash in at least a first flashing pattern indicating that the vehicle battery needs to be checked and in a second flashing pattern indicating that the vehicle battery does not need to be checked.

Other features which are considered as characteristic for the invention are set forth in the appended claims.

Although the invention is illustrated and described herein as embodied in a method for monitoring a vehicle battery and a motor vehicle having a battery monitoring configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
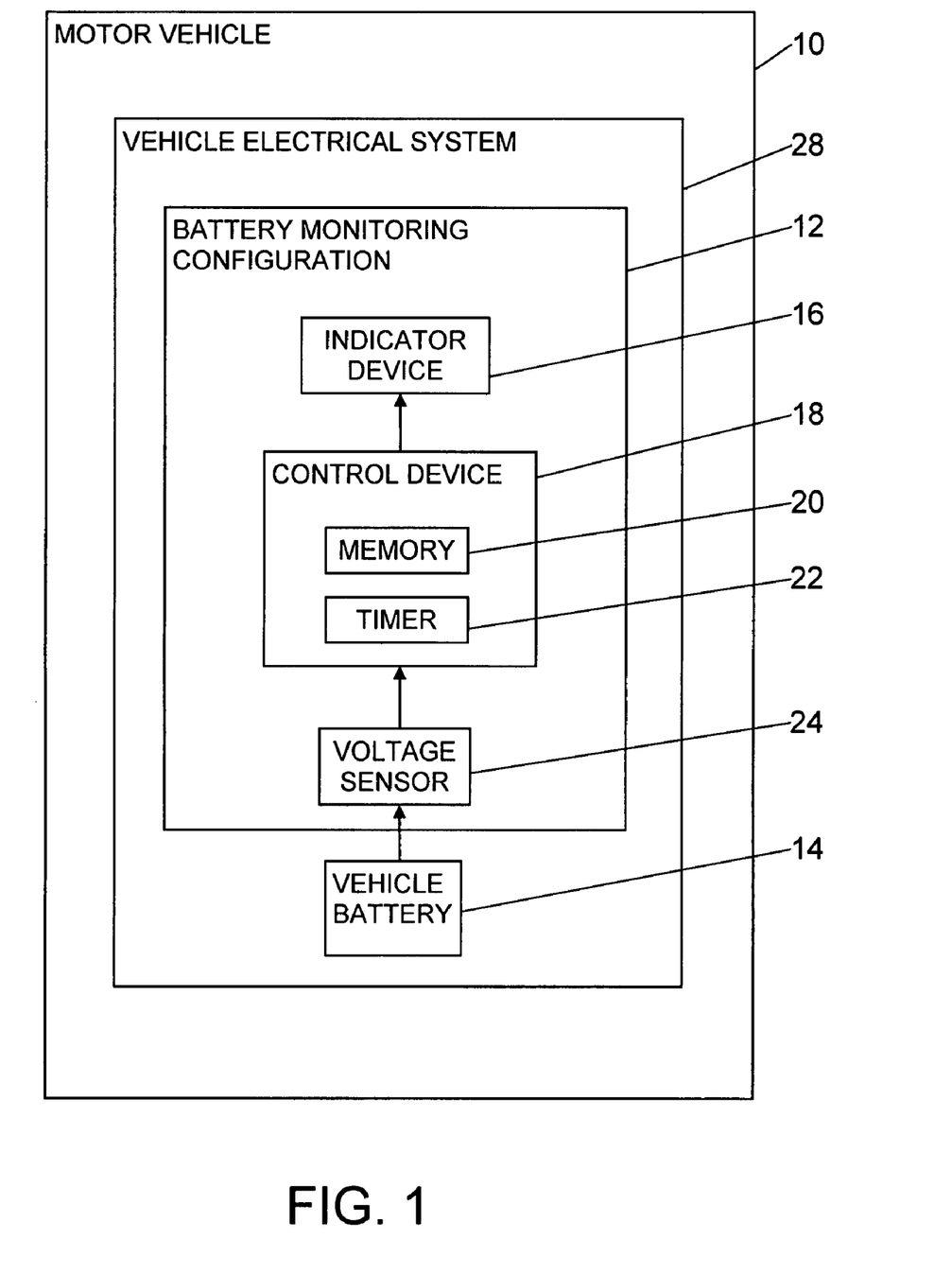
FIG. 1 is a schematic view of a motor vehicle having a configuration for monitoring a vehicle battery according to the invention.

Referring now to the figures of the drawings in detail and first, particularly, to FIG. 1 thereof, there is shown a schematic view of a motor vehicle 10 having a battery monitoring configuration 12 for monitoring a vehicle battery 14 according to the invention. The battery monitoring configuration 12 includes an indicator device 16 for providing an audible or visible signal that can be heard or seen by an observer standing outside the motor vehicle 10. In a preferred embodiment, the indicator device 16 is a light emitting diode mounted next to the locking knob 26 on the top portion of the inside door panel of the driver-side front door of the motor vehicle 10 such that the light emitting diode can be seen when standing next to the motor vehicle 10. In another embodiment, the indicator device 16 is a light emitting diode mounted on the dashboard of the motor vehicle 10 such that the light emitting diode can be seen when standing outside the motor vehicle 10. The purpose of providing the indicator device 16 such that it can convey information about the state of the vehicle battery 14 to an observer standing outside the motor vehicle 10 is that this allows checking the batteries of vehicles without having to unlock the motor vehicle and without having to get into the motor vehicle or open the hood of the motor vehicle. This allows for example checking the state of batteries of a shipment of hundreds of motor vehicles simply by walking past those vehicles and looking at the light emitting diodes visible from outside the vehicles.

The light emitting diode operating as the indicator device 16 preferably has two functions. First, when the electrical system 28 of the motor vehicle 10 operates in a power conservation mode, also called transport mode, which reduces electric power consumption of vehicle systems, the light emitting diode 16 operates as the indicator device 16 that provides information about the status of the battery. When the power conservation mode is switched off and the electrical system 28 of the motor vehicle 10 is in its normal operating mode, then the light emitting diode 16 serves as a warning light that indicates that the central locking system has locked the vehicle doors and, if applicable, has activated a vehicle anti-theft immobilizer and/or a vehicle alarm system.

The battery monitoring configuration 12 further includes a control device 18 that performs the monitoring functions. The control device 18 is preferably a vehicle control device 18 such as the vehicle electrical system control module. When the vehicle is in the power conservation mode, the control device 18 operates to monitor the vehicle battery 14. When the power conservation mode is deactivated and the electrical system 28 of the motor vehicle 10 is in its normal operating mode, the control device 18 performs for example the regular tasks of a vehicle electrical system control module such as controlling exterior and interior lights and windshield wipers and performing an electric load control.

The control device 18 includes a memory 20 for storing operating programs and/or data and a timer 22. The battery monitoring configuration 12 further includes the voltage sensor 24. The voltage sensor 24 is connected to a vehicle battery 14 in order to measure a battery voltage and is connected to the control device 18 in order to provide values of the measured battery voltage to the control device 18. The battery monitoring configuration 12 may include further sensors that provide information to be used for determining a status of the vehicle battery 14. For example, the battery monitoring configuration 12 may include a temperature sensor for measuring an ambient temperature. The measurement of the ambient temperature together with other measurements may then be used by the control device 18 in order to determine a status or a pre-existing defect of the vehicle battery 14.

Figure 2:
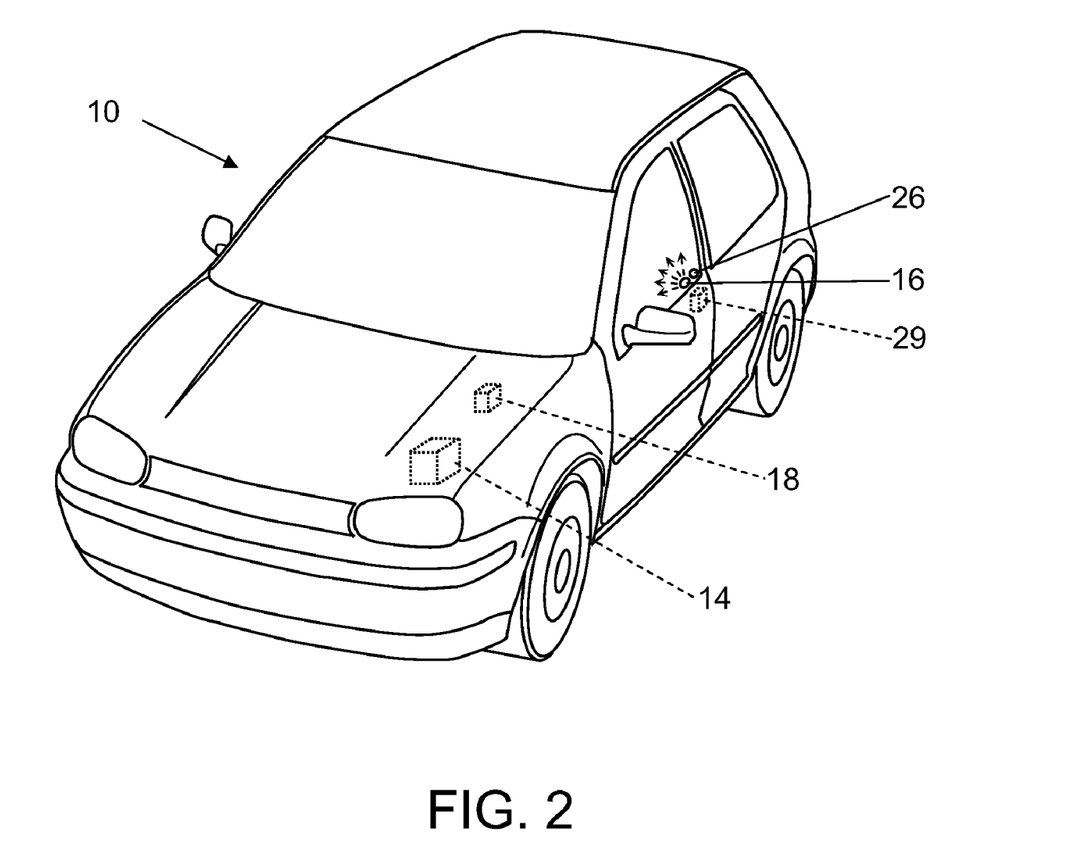
FIG. 2 is a diagrammatic perspective view of a motor vehicle having a configuration for monitoring a vehicle battery according to the invention.

FIG. 2 is a diagrammatic perspective view of a motor vehicle 10 having a configuration for monitoring a vehicle battery 14 according to the invention. The vehicle battery 14 and the control device 18 are mounted in the motor vehicle 10 and are part of the electrical system 28 of the motor vehicle 10. The indicator device 16 is a light emitting diode 16 that is positioned next to the locking knob 26 for the door lock 29. The light emitting diode 16 is positioned such that it is visible from outside the motor vehicle 10. The light emitting diode 16 serves as the indicator device 16 for the battery monitoring configuration 12 when the electrical system 28 of the motor vehicle 10 is in the power conservation mode and serves as the warning light for the central locking system when the power conservation mode is deactivated and the electrical system 28 of the motor vehicle 10 is in its normal operating mode. Thus, no extra hardware is required for the indicator device 16 according to the invention.

Figure 3:
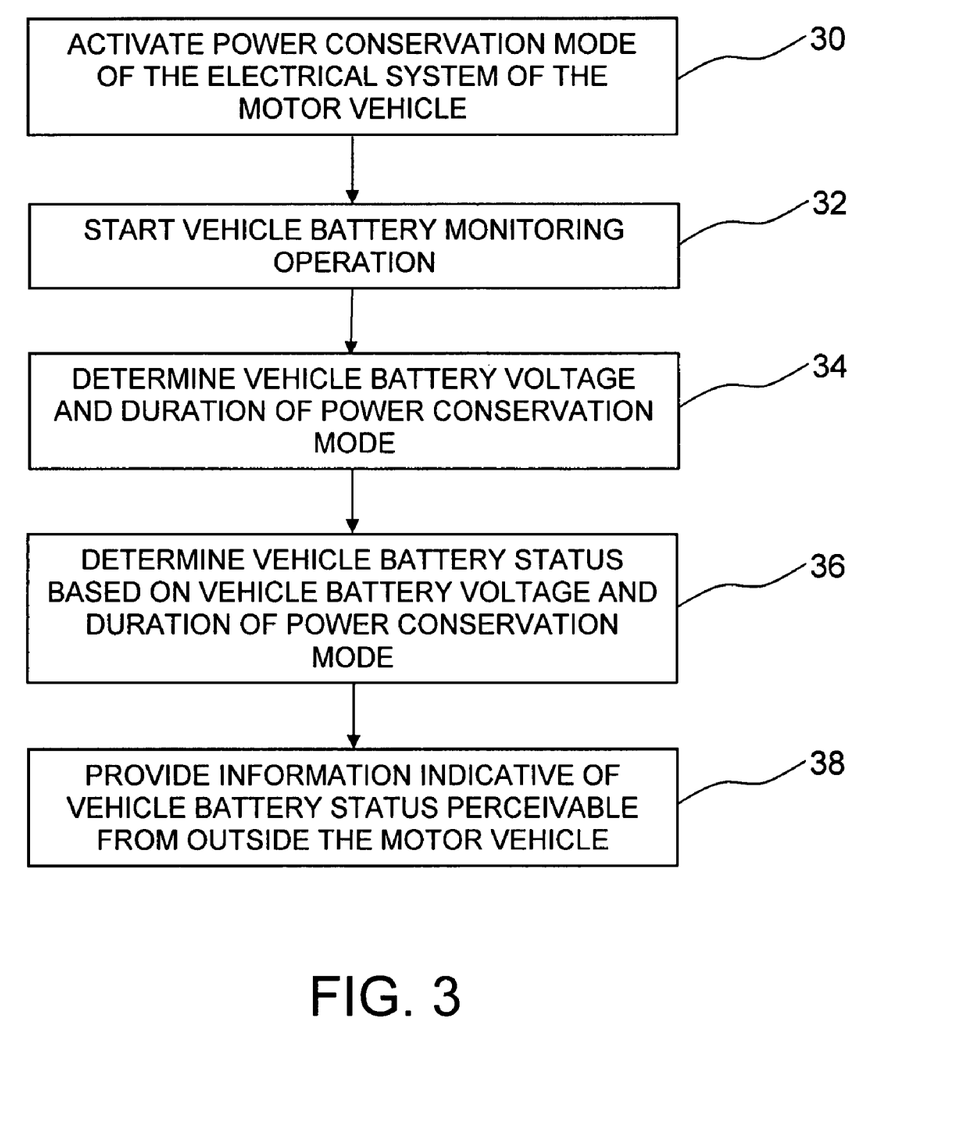
FIG. 3 is a basic flow chart illustrating steps of the method for monitoring a vehicle battery according to the invention.

FIG. 3 is a flow chart illustrating steps of the method for monitoring a vehicle battery 14 according to the invention. In a first step 30, the power conservation mode of the electrical system 28 of the motor vehicle 10 is activated in order to reduce the quiescent current drawn by the electrical system 28 of the motor vehicle 10. When the power conservation mode is activated, electric loads related to comfort functions and infotainment functions are deactivated in order to reduce the consumption of electric power during transport or storage of the motor vehicle. Specifically, the central locking function, the power windows, the stereo system, remote control functions, vehicle seat memory functions, interior lighting functions and the air conditioning may be deactivated or have a reduced functionality when the power conservation mode is activated. The power conservation mode only deactivates non-essential functions so that the engine of the motor vehicle 10 can be started and the vehicle can be driven when the power conservation mode is activated. The power conservation mode is for example activated prior to shipping motor vehicles overseas and is again deactivated once the vehicles arrive at the destination port. The deactivation can be performed by programming the control device 18 of the motor vehicle 10 via a diagnosis plug provided in the vehicle. Alternatively, the power conservation mode may be automatically deactivated after the motor vehicle 10 has been driven for a given number of miles.

After the power conservation mode has been activated, a battery monitoring operation is started in step 32. Specifically a timer 22 is started in order to record a time when the power conservation mode was activated so that the control device 18 can be provided with information about the duration of the activation of the power conservation mode. Further, as indicated by step 34, the quiescent battery voltage is measured at given time intervals via the voltage sensor 24. If desired, further parameters that are relevant for determining the state of the vehicle battery 14 can be determined. For example, in addition to the battery voltage, the ambient temperature may be determined. In accordance with one embodiment of the invention, the measured voltage values and temperature values can be stored in the memory 20 of the control device 18 and can be used to determine the status of the vehicle battery 14.

Based on the information provided by the voltage measurement, the timer information and, if desired further information such as the ambient temperature, the status of the vehicle battery 14 is determined in step 36. In a preferred embodiment, the status of the vehicle battery 14 is determined based on the measured quiescent voltage of the vehicle battery 14 and the duration of the activation of the power conservation mode. The control device 18 determines whether the measured quiescent battery voltage is less than 11.6V, between 11.6V and 12.2V, between 12.2V and 12.5V, between 12.5V and 12.65V or greater than 12.65V. Based on which of the above-defined voltage intervals applies to the measured quiescent voltage of the vehicle battery 14 and based on the duration of the power conservation mode, the control device 18 determines a status of the vehicle battery 14 and provides in step 38 information about the status of the vehicle battery 14 such that the information can be perceived from outside the motor vehicle 10. In accordance with a preferred embodiment of the invention, the information about the status of the battery is communicated by controlling a light emitting diode 16 such that the light emitting diode flashes in accordance with a given flashing code. For example, the status of the vehicle battery 14 may correspond to the flashing frequency of the light emitting diode such that a given high flashing frequency of the light emitting diode indicates that the vehicle battery 14 has no defects, is charged and there is no need to charge the vehicle battery 14. A given low flashing frequency of the light emitting diode would indicate that the battery is discharged to an extend that makes it necessary to charge the battery. A pre-existing defect of the battery may be detected if the control device 18 determines that the measured quiescent voltage of the battery drops faster than a given rate. Such a defective vehicle battery 14 could be indicated by a lowest flashing frequency or a specific flashing code indicative of a defective battery that needs to be replaced. Further, if the duration of activation of the power conservation mode exceeds a given shelf life of the vehicle battery 14, then the vehicle battery 14 could be classified as defective which could be indicated by the lowest flashing frequency.

Figure 4:
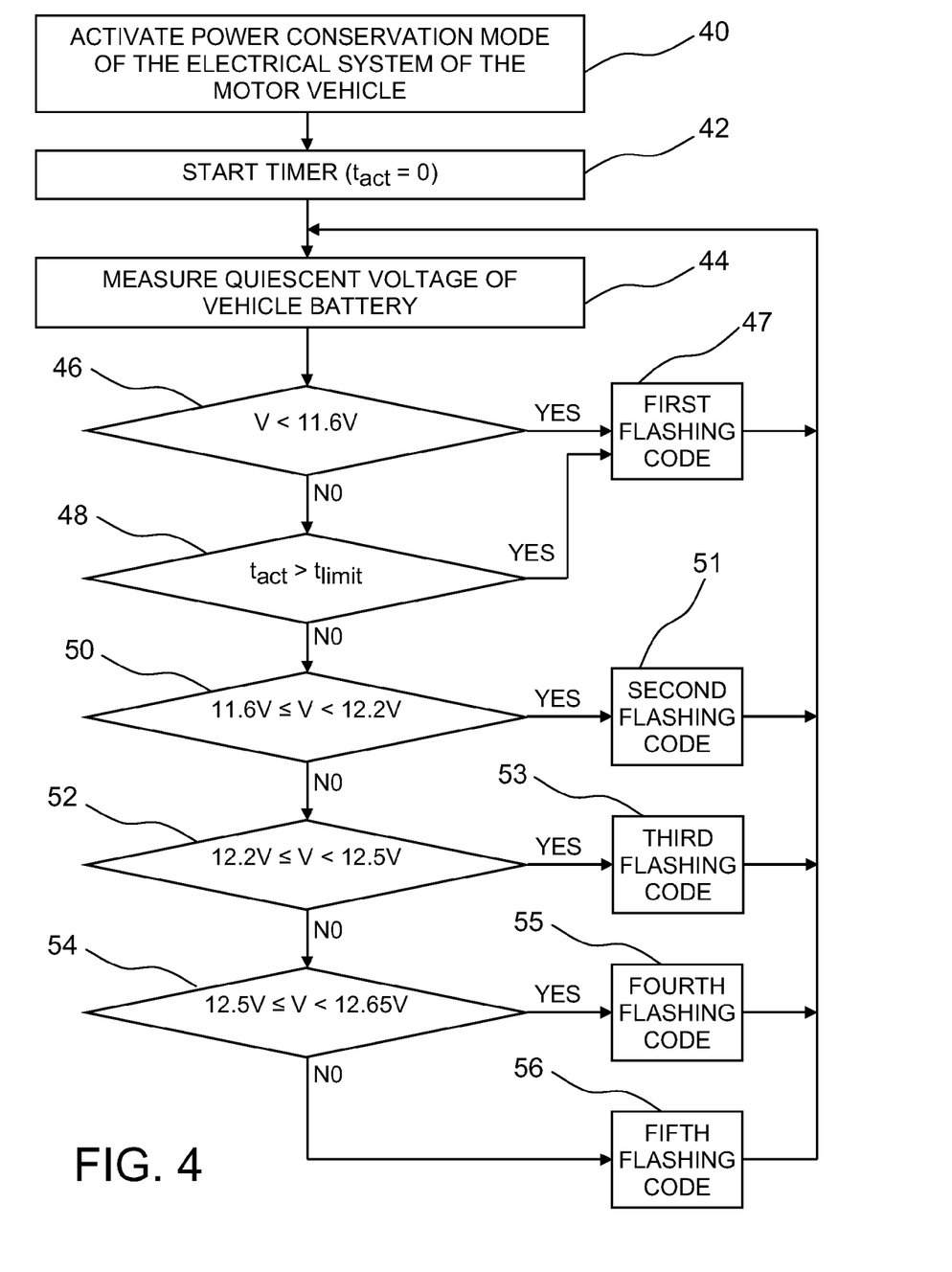
FIG. 4 is a flow chart illustrating an exemplary mode of the method for monitoring a vehicle battery according to the invention.

FIG. 4 is a flow chart illustrating an exemplary mode of the method for monitoring a vehicle battery 14 according to the invention. In a first step 40, the power conservation mode of the electrical system 28 of the motor vehicle 10 is activated. When the power conservation mode is activated, a timer 22 is started in step 42 in order to measure the duration $t_{act}$ of the activation of the power conservation mode. In a step 44, the quiescent voltage V of the vehicle battery 14 is measured. In a subsequent step 46, a determination is made whether the measured quiescent voltage of the vehicle battery 14 is less than 11.6V. If the measured quiescent voltage of the vehicle battery 14 is less than 11.6V, then, in step 47, a first flashing code is communicated to an observer outside the motor vehicle 10 via a light emitting diode 16. A measured quiescent voltage of less than 11.6V indicates that the vehicle battery 14 is completely discharged or has some kind of defect. Thus, the first flashing code indicates that the vehicle battery 14 needs to be checked for defects and if the battery is not defective, the battery needs to be immediately charged.

In a step 48, it is determined whether the duration $t_{act}$ of the activation of the power conservation mode is greater than a limit duration $t_{limit}$. The limit duration $t_{limit}$ corresponds for example to a duration corresponding to the shelf life of the vehicle battery 14. If the electrical system 28 of the motor vehicle 10 has been in the power conservation mode for several months, then a duration corresponding to the shelf life of the vehicle battery 14 may have been reached and the battery may have lost its capability of becoming fully recharged. In that case, the vehicle battery 14 may need to be replaced. If the duration $t_{act}$ of the activation of the power conservation mode is greater than a limit duration $t_{limit}$, then the first flashing code is communicated to an observer outside the motor vehicle 10 via the light emitting diode 16. Since, as stated above, the first flashing code indicates the possibility of a serious defect, the vehicle battery 14 must be checked and possibly replaced.

In a step 50, a determination is made whether the quiescent voltage V of the vehicle battery 14 is between 11.6V and 12.2V. If the measured quiescent voltage of the vehicle battery 14 is between 11.6V and 12.2V, then the light emitting diode 16 flashes in accordance with a second flashing code in step 51. The voltage range between 11.6V and 12.2V indicates that the vehicle battery 14 has lost at least 50% of its charge. In step 51, the second flashing code indicates that the vehicle battery 14 should be recharged because the battery charge may soon become too small to start the engine.

In a step 52, it is determined whether the measured quiescent voltage V of the vehicle battery 14 is in a voltage range from 12.2V to 12.5V. If the measured quiescent voltage of the vehicle battery 14 is in this range, then the battery monitoring configuration 12 provides a third flashing code in step 53. A quiescent voltage of the vehicle battery 14 between 12.2V and 12.5V indicates that the state of charge of the vehicle battery 14 is substantially between 50% and 75%. The vehicle battery 14 should therefore be charged if the motor vehicle 10 is to be stored or transported for more than several weeks in order to make sure that the vehicle battery 14 is sufficiently charged to start the engine once the vehicle arrives at its destination.

If the measured quiescent voltage V of the vehicle battery 14 is in a voltage range from 12.5V to 12.65V as indicated in step 54, the battery monitoring configuration 12 provides a fourth flashing code in step 55. A quiescent voltage of the vehicle battery 14 between 12.5V and 12.65V indicates that the state of charge of the vehicle battery 14 is above 75%. In this case it may not be necessary to charge the vehicle battery 14 unless the vehicle is to be stored or transported for more than several weeks. Finally, if the measured quiescent voltage V of the vehicle battery 14 is greater than 12.65V, the vehicle battery 14 is fully charged. In step 56, the light emitting diode 16 indicates a fully charged vehicle battery 14 with a fifth flashing code.

As stated above, the flashing codes may be differentiated by different flashing patterns, for example different flashing frequencies, such that the first flashing code corresponds to a first flashing frequency, the second flashing code corresponds to a second flashing frequency and so forth. Different codes can however also be provided by different colors. For example, a red color may indicate that the vehicle battery 14 has a defect or is completely discharged. A yellow color may indicate that the vehicle battery 14 is partially discharged but is still able to start the engine. A green color may indicate that the vehicle battery 14 is fully charged. In accordance with another embodiment of the invention, the flashing codes and the color codes can be combined. For example a flashing red light may indicate that the vehicle battery 14 has a preexisting defect and therefore the vehicle battery 14 needs to be replaced, whereas a red light that does not flash may indicate that the vehicle battery 14 is substantially completely discharged and therefore the vehicle battery 14 needs to be charged. The invention has been explained with reference to specific embodiments. Further embodiments and modes will be apparent to those of ordinary skill in the art. It is therefore not intended that this invention be limited to the described embodiments, except as defined by the appended claims.

What is claimed is:

1. A method for monitoring a battery, the method which comprises:
    activating a power conservation mode of an electrical system of a motor vehicle, the power conservation mode being a transport mode for reducing consumption of electric power during transport or storage of the motor vehicle;
    measuring a duration of activation of the power conservation mode of the electrical system;
    repeatedly measuring a quiescent voltage of a vehicle battery of the motor vehicle when the power conservation mode of the electrical system of the motor vehicle is activated;
    determining a battery status based on the duration of activation of the power conservation mode and based on the quiescent voltage of the vehicle battery; and
    providing information indicative of the battery status such that the information is perceivable outside the motor vehicle when the power conservation mode of the electrical system of the motor vehicle is activated and an ignition lock of the motor vehicle has no vehicle key inserted therein.

2. The method according to claim 1, which comprises providing the information indicative of the battery status by using a visual indicator device mounted in the interior of the motor vehicle and visible from outside the motor vehicle.

3. The method according to claim 1, which comprises:
    providing the information indicative of the battery status by using a light emitting diode mounted adjacent to a vehicle window such that the light emitting diode is visible from outside the motor vehicle; and
    controlling the light emitting diode such that the light emitting diode provides information that is not indicative of the battery status when the power conservation mode is deactivated.

4. The method according to claim 1, which comprises providing the information indicative of the battery status by using a flashing code such that a respective flashing pattern indicates a respective battery status.

5. The method according to claim 1, which comprises:
    allocating the quiescent voltage of the vehicle battery to a voltage range selected from the group consisting of a voltage less than 11.6V, a voltage between 11.6V and 12.2V, a voltage between 12.2V and 12.5V, a voltage between 12.5V and 12.65V, and a voltage greater than 12.65V; and
    determining the battery status based on the duration of activation of the power conservation mode and based on the voltage range.

6. A motor vehicle configuration, comprising:
    a motor vehicle having a vehicle electrical system including an ignition lock, a vehicle key, a control device, a vehicle battery, a voltage sensor and an indicator device;
    said control device being configured to selectively operate said vehicle electrical system in a power conservation mode and in a normal operating mode, the power conservation mode being a transport mode for reducing consumption of electric power during transport or storage of said motor vehicle;
    said control device including a timer and being configured to determine a power conservation mode activation duration when operating said vehicle electrical system in said power conservation mode;
    said voltage sensor being operatively connected to said vehicle battery and being configured to repeatedly measure a quiescent battery voltage when said vehicle electrical system operates in said power conservation mode;
    said control device determining a battery status as a function of the quiescent battery voltage and the power conservation mode activation duration; and
    said indicator device being operatively connected to said control device and being configured to provide information indicative of the battery status such that the information is perceivable from outside said motor vehicle when said vehicle electrical system operates in the power conservation mode and said vehicle key is not inserted in said ignition lock.

7. The motor vehicle configuration according to claim 6, wherein said motor vehicle has a vehicle interior, said indicator device is a visual indicator device disposed in said vehicle interior.

8. The motor vehicle configuration according to claim 6, wherein:
   said motor vehicle has a vehicle interior and a vehicle window; and
   said indicator device is a light emitting diode disposed in said vehicle interior, adjacent to said vehicle window.

9. The motor vehicle configuration according to claim 6, wherein:
   said indicator device provides information indicative of the battery status when said vehicle electrical system operates in the power conservation mode; and
   said indicator device provides information that is not indicative of the battery status when said vehicle electrical system operates in the normal operating mode.

10. The motor vehicle configuration according to claim 6, wherein:
    said motor vehicle has a vehicle door with an inside door panel, said indicator device is a light emitting diode mounted on said inside door panel;
    said light emitting diode provides information indicative of the battery status when said vehicle electrical system operates in the power conservation mode; and
    said light emitting diode provides information indicative of said vehicle door being locked when said control device operates in the normal operating mode.

11. The motor vehicle configuration according to claim 6, wherein said indicator device is a visual indicator device configured to selectively flash in at least a first flashing pattern indicating that said vehicle battery needs to be checked and in a second flashing pattern indicating that said vehicle battery does not need to be checked.

* * * * *